United States Patent [19]

Otto

[11] 4,068,198

[45] Jan. 10, 1978

[54] PHASE-LOCKED LOOP FREQUENCY SHIFT KEY MODULATOR

[75] Inventor: Jeffrey C. Otto, Framingham, Mass.

[73] Assignee: GTE Sylvania Incorporated, Stamford, Conn.

[21] Appl. No.: 753,797

[22] Filed: Dec. 23, 1976

[51] Int. Cl.² .................. H03C 3/00; H04L 27/12
[52] U.S. Cl. .................................. 332/19; 325/163; 325/184; 331/25
[58] Field of Search .................... 332/9 R, 16 R, 19; 325/30, 143, 148, 163, 164, 184; 331/1 A, 18, 23, 25

[56] References Cited

U.S. PATENT DOCUMENTS

| 3,551,826 | 12/1970 | Sepe | 331/1 A X |
| 3,805,192 | 4/1974 | Ocnaschek et al. | 332/16 R |
| 3,997,855 | 12/1976 | Nash | 332/9 R |

Primary Examiner—Siegfried H. Grimm
Attorney, Agent, or Firm—David M. Keay; Norman J. O'Malley; Peter Xiarhos

[57] ABSTRACT

MSK modulating apparatus employing a phase-locked loop. The loop includes a programmable divider which divides the output frequency of the voltage controlled oscillator by a relatively high value if binary 1 information is to be transmitted and by a relatively low value if binary 0 information is to be transmitted. The output of the voltage controlled oscillator is also divided by an output divider to obtain the desired carrier frequency and then filtered to provide a sinusoidal output signal. The resulting output signal varies by a differential frequency above or below a carrier center frequency when transmitting binary 1 or binary 0 data, respectively.

3 Claims, 2 Drawing Figures

PHASE-LOCKED LOOP FREQUENCY SHIFT KEY MODULATOR

CROSS-REFERENCE TO RELATED APPLICATION

Application Ser. No. 753,799 entitled "Digital Frequency Modulating Apparatus" filed concurrently herewith by Herbert S. Madoff and assigned to the assignee of the present application is broadly concerned with frequency modulating apparatus employing a phase-locked loop.

BACKGROUND OF THE INVENTION

This invention relates to communication apparatus. More particularly, it is concerned with apparatus for producing a carrier frequency signal which is frequency shift key (FSK) modulated by a digital data stream.

Broadly, frequency shift keying (FSK) is the modulating of a carrier frequency to shift its frequency by predetermined increments in response to particular data to be transmitted. A special form of frequency shift keying employed in transmitting binary information is known as minimum shift keying (MSK). In MSK modulation the frequency shifts are phase continuous. That is, the transmitted signal is a sinusoidal signal which varies in frequency but has no time-phase discontinuities. A binary 0 is transmitted at a frequency below the center frequency of the carrier and a binary 1 is transmitted at a frequency above the center frequency. The differential between each of the transmitted frequencies and the center frequency of the carrier is equal to the modulation rate, or data rate, divided by four.

Although apparatus for producing MSK signals are well-known, they are relatively complicated and expensive. A large number of digital circuits including counters, dividers, and gates are required. Several one-shot multivibrators are employed to detect zero crossings in order to control the apparatus so as to maintain phase continuity. There are also problems in synthesizing frequencies in certain ranges of frequency thus limiting the flexibility of the apparatus.

SUMMARY OF THE INVENTION

A relatively simple frequency shift key modulating apparatus for MSK modulation is provided by apparatus in accordance with the present invention. The apparatus includes a means for producing a reference frequency signal and a voltage controlled oscillator. A programmable dividing means divides the frequency of the output signal from the voltage controlled oscillator by a preset value. A phase detector means has a first input which is coupled to the means for producing the reference frequency signal, a second input which is coupled to the output of the programmable dividing means, and an output which is coupled to the input of the voltage controlled oscillator. The foregoing combination of elements provides a phase-locked loop in which the frequency of the output signal from the voltage controlled oscillator is equal to the frequency of the reference frequency signal multiplied by the preset value applied to the programmable dividing means.

The apparatus also includes a first means for producing a first signal designating a first preset value and a second means for producing a second signal designating a second preset value. A selection means is coupled to the programmable dividing means and to the first and second means. Data signals at either a first level or a second level are received by the selection means. In response to a data signal at the first level the selection means applies the first signal designating the first preset value to the programmable dividing means, and in response to a data signal at the second level applies the second signal designating the second preset value to the programmable dividing means. Thus, the output signal from the voltage controlled oscillator is at a first frequency (the reference frequency multiplied by the first preset value) when a data signal at the first value is being received by the selection means, and is at a second frequency (the reference frequency multiplied by the second preset value) when a data signal at the second level is being received by the selection means.

BRIEF DESCRIPTION OF THE DRAWINGS

Additional objects, features, and advantages of frequency shift key modulating apparatus in accordance with the present invention will be apparent from the following detailed discussion together with the accompanying drawings wherein.

DETAILED DESCRIPTION OF THE INVENTION

Figure 2:
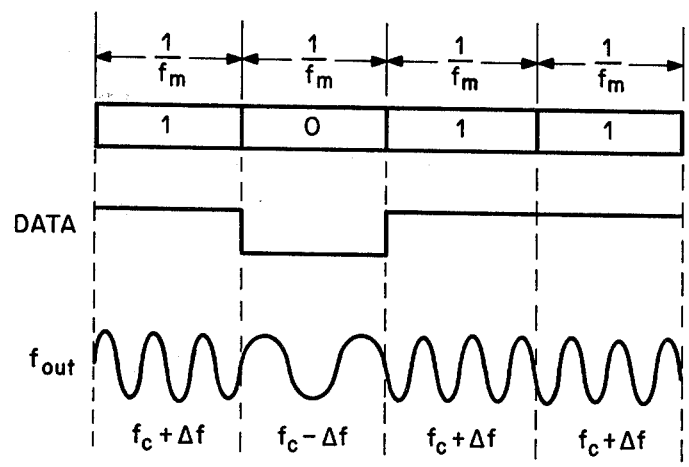
FIG. 2 is a timing diagram illustrating relationships between exemplary input signal data received by the apparatus of FIG. 1 and the MSK output signal produced.

In accordance with the MSK format a binary 1 is transmitted as a frequency signal which is equal to a center frequency plus a differential frequency ($f_c + \Delta f$) and a binary 0 is transmitted as a frequency signal which is equal to the center frequency minus the differential frequency ($f_c - \Delta f$). This relationship is illustrated in FIG. 2 which shows an example of binary input data and the resulting output signal $f_{out}$ produced. The output signal has no time-phase discontinuities and the differential frequency is equal to one-fourth of the modulation frequency, or data rate ($\Delta f = f_m/4$).

Figure 1:
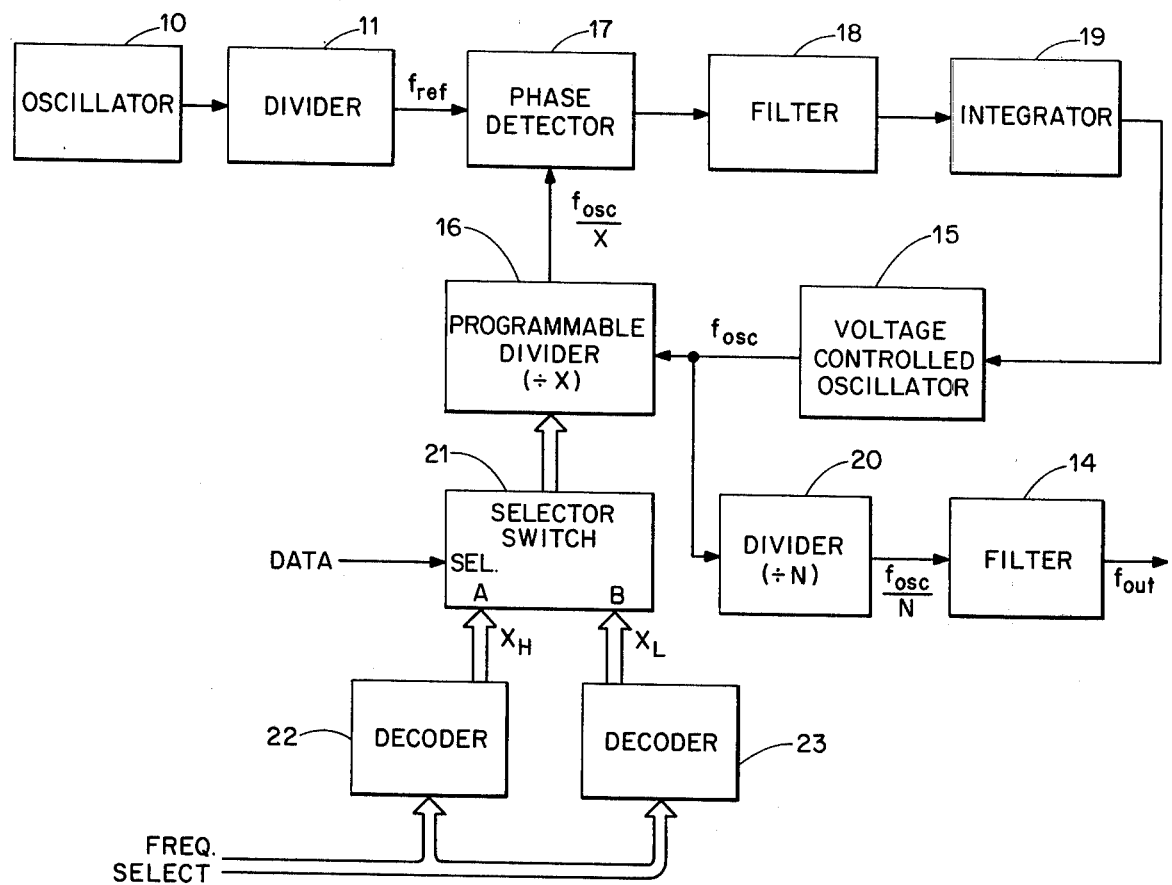
FIG. 1 is a schematic block diagram of an MSK modulating apparatus in accordance with the present invention.

FIG. 1 illustrates an MSK modulator in accordance with the present invention. The apparatus includes an oscillator 10 which may be a highly stable temperature-compensated crystal oscillator. The oscillator output frequency is divided by a divider 11 to provide a reference frequency signal $f_{ref}$. The reference frequency signal $f_{ref}$ is applied to a phase-locked loop which employs a voltage controlled oscillator 15. A voltage controlled oscillator is a well-known device which produces an output frequency signal related to its input voltage. The output $f_{osc}$ of the voltage controlled oscillator is applied to a programmable divider 16 which divides the frequency of the oscillator output by a preset value (X) applied to the divider.

The phase-locked loop also includes a phase detector 17 which has a first input connected to the divider 11 in order to receive the reference frequency signal $f_{ref}$, and has a second input connected to the programmable divider 16 in order to receive the oscillator frequency divided by the preset value $f_{osc}/X$. The output of the phase detector 17 is passed through a low pass filter 18 and an integrator 19 to provide a DC voltage to the voltage controlled oscillator 15. The phase-locked loop operates in a conventional manner with the phase detector 17 producing an error voltage related to the phase and frequency difference between its input signals. The error voltage is appropriately filtered and integrated and applied to the voltage controlled oscillator 15 causing the output of the voltage controlled oscillator 15 to be equal to the reference frequency multiplied by the present value applied to the programmable divider 16. That is, $f_{osc} = X f_{ref}$.

The output $f_{osc}$ of the voltage controlled oscillator 15 is also applied to an output divider 20 which divides the oscillator frequency signal by a fixed amount (N). The resulting frequency $f_{osc}/N$ is the output frequency to be transmitted. This signal is passed through a filter 14 to provide a sinusoidal ouput signal $f_{out}$.

The preset value X is applied to the programmable divider 16 by a selector switch 21. The selector switch 21 has two sets of binary information inputs and a select input. DATA signals of a relatively high level designating a binary 1 and of a relatively low level designating a binary 0, as illustrated in the example of FIG. 2, are applied in a continuous stream at the select input. A relatively high preset value $X_H$ is applied to the programmable divider 16 by the selector switch 21 when the DATA signal is high and a relatively low preset value $X_L$ is applied when the DATA signal is low. As shown in FIG. 1 a FREQ SELECT signal applied to decoders 22 and 23 is decoded by the decoders to produce binary signals designating appropriate values of $X_H$ and $X_L$ for a particular carrier center frequency $f_c$ of the output signal $f_{out}$. Sets of values of $X_H$ and $X_L$ are provided to permit the apparatus to be employed for use at more than one carrier frequency. Alternatively, if the apparatus is to be used at only a single carrier frequency, fixed values of $X_H$ and $X_L$ are applied to the selector switch 21, thus eliminating the decoders 22 and 23.

The output of the selector switch 21 is applied to the programmable divider 16. The programmable divider is a counter which counts downward from the present value which is placed therein on the pulses from the output $f_{osc}$ of the voltage controlled oscillator 15. When the count is reduced to all zeros, an output pulse at the frequency $f_{osc}/X$ is produced to the phase detector 17. The preset value (X) from the selector switch 21 is loaded into the programmable divider on the output pulse to initiate the next countdown sequence. The preset value is changed by a change in the DATA input.

In one specific embodiment of the apparatus illustrated in FIG. 1 the data rate $f_m$ was 16 Hz and the carrier center frequency $f_c$ was 76 Hz. In accordance with the MSK format the differential frequency $\Delta f$ was 4 Hz. ($\Delta f = f_m/4$). Thus, the output frequency $f_{out}$ for transmitting a binary 1 was 80 Hz ($f_c + \Delta f$) and for tramsmitting a binary 0 was 72 Hz ($f_c - \Delta f$). The reference frequency $f_{ref}$ which was selected on the basis of the operating characteristics of the components employed in the apparatus was 10 KHz. This frequency was obtained by dividing the output frequency of 1 MHz from the oscillator 10 by 100 in the divider 11. Thus, the appropriate preset values $X_H$ and $X_L$ to be applied to the programmable divider 21 by the selector switch 21 were 80 and 72, respectively. The output divider 20 divided the output from the voltage controlled oscillator 15 by 10,000 (N).

When a high level DATA signal designating a binary 1 was being received, the selector switch 21 applied a preset value of 80 ($X_H$) to the programmable divider 16. The phase-locked loop operated to cause the output of the voltage controlled oscillator 15 to be 800,000 Hz. ($f_{osc} = X f_{ref}$). This output was divided by 10,000 by the output divider 20 producing an output frequency $f_{out}$ of 80 Hz. When a low level DATA signal designating a binary 0 was being received, a preset value of 72 ($X_L$) was applied to the programmble divider 16 causing the output frequency of the voltage controlled oscillator 15 $f_{osc}$ to be 720,000 Hz. This frequency divider by the output divider 20 produced an output signal $f_{out}$ of 72 Hz. The output signal as illustrated in FIG. 2 met the MSK format criteria of a continuous sinusoidal signal with no time-phase discontinuities at the transitions between the transmissions of binary 1 and binary 0 information. The apparatus is relatively simple and uncomplicated employing individual devices and components of straightforward conventional design.

While there has been shown and described what is considered a preferred embodiment of the present invention, it will be obvious to those skilled in the art that various changes and modifications may be made therein without departing from the invention as defined by the appended claims.

What is claimed is:

1. Frequency shift key modulating apparatus including in combination means for producing a reference frequency signal;

a voltage controlled oscillator;

programmable dividing means coupled to the output of the voltage controlled oscillator for dividing the frequency of the output signal from the voltage controlled oscillator by a preset value;

phase detector means having a first input coupled to said means for providing a reference frequency signal, a second input coupled to the output of said programmable dividing means, and an output coupled to the input of the voltage controlled oscillator to produce a phase-locked loop, in which the frequency of the output signal from the voltage controlled oscillator is equal to the frequency of the reference frequency signal multiplied by the preset value;

first means for producing a first signal designating a first preset value;

second means for producing a second signal designating a second preset value; and selection means coupled to said programmable dividing means and to said first and second means and being operable to receive data signals at a first level and data signals at a second level, said selection means being operable in response to receiving a data signal at the first level to apply said first signal designating a first preset value to said programmable dividing means and being operable in response to receiving a data signal at the second level to apply said second signal designating a second preset value to said programmable dividing means; whereby the output signal from the voltage controlled oscillator is at a first frequency when a data signal at the first level is being received by the selection means and the output signal from the voltage controlled oscillator is at a second frequency when a data signal at the second level is being received by the selection means;

said selection means receiving continuous data signals, each data signal being present during a predetermined time interval, a data signal at said first level for said predetermined time interval representing a first binary digit and a data signal at said second level for said predetermined time interval representing a second binary digit.

2. Frequency shift key modulating apparatus in accordance with claim 1 wherein
said first means produces a first signal designating a value of frequency which is greater than a center frequency by a specific amount; and
said second means produces a second signal designating a value of frequency which is less than said center frequency by said specific amount;
and including
output dividing means coupled to said voltage controlled oscillator for dividing the frequency of the output signal from the voltage controlled oscillator by a fixed amount so that the frequency of the signal produced at the output of the output dividing means by a data signal at the first level received by the selection means differs from the frequency of the signal produced at the output of the output dividing means by a data signal at the second level received by the selection means by an amount equal to one-half the frequency of said data signals.

3. Frequency shift key modulating apparatus in accordance with claim 2 wherein
said first and second means are operable to produce a set of first signals and a corresponding set of second signals, respectively, said first and second means being operable to produce particular first and second signals from said sets in response to input signals designating particular center frequencies.

* * * * *